United States Patent
Sriram et al.

(10) Patent No.: US 6,668,092 B1
(45) Date of Patent: Dec. 23, 2003

(54) MEMORY EFFICIENT VARIABLE-LENGTH ENCODING/DECODING SYSTEM

(75) Inventors: Parthasarathy Sriram, San Jose, CA (US); Subramania Sudharsanan, Union City, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/364,311

(22) Filed: Jul. 30, 1999

(51) Int. Cl.[7] ................................................. G06K 9/36
(52) U.S. Cl. ........................ 382/244; 382/246; 382/248; 382/245
(58) Field of Search ................................ 382/238, 239, 382/243, 244, 246, 249, 232, 245, 247, 248, 235, 236, 237, 240; 358/426.13, 426.03, 426.04, 426.14, 394.1, 395.1; 375/240.1; 345/555; 348/402.1, 416.1

(56) References Cited

U.S. PATENT DOCUMENTS

| | | | | |
|---|---|---|---|---|
| 4,899,148 A | | 2/1990 | Sato et al. ..................... 341/65 |
| 5,249,241 A | * | 9/1993 | Silverman et al. ........... 382/231 |
| 5,481,704 A | * | 1/1996 | Pellicano ...................... 395/600 |
| 5,532,694 A | * | 7/1996 | Mayers et al. ................. 341/67 |
| 5,745,392 A | * | 4/1998 | Ergas et al. ............. 364/715.02 |
| 5,835,034 A | * | 11/1998 | Swroussi et al. .............. 341/65 |
| 5,850,482 A | * | 12/1998 | Meany et al. ................ 382/232 |
| 5,973,626 A | * | 10/1999 | Berger et al. .................. 341/65 |
| 6,091,853 A | * | 7/2000 | Otto ............................. 382/232 |

\* cited by examiner

*Primary Examiner*—Bhavesh M. Mehta
*Assistant Examiner*—Yosef Kassa
(74) *Attorney, Agent, or Firm*—Gunnison, McKay & Hodgson, L.L.P.; Philip J. McKay

(57) ABSTRACT

A lossless compression mechanism for compressing and restoring data elements such as text, text formatting, video, audio, speech, and 2D and 3D graphical information. Each data element is compressed using a data structure having a bin number field and an offset field. The bin number field is associated to a bin having a range of values which includes the data element value. The offset field is computed from a minimum bin value, wherein the minimum bin value is associated to the bin and is stored in a bin lookup table. The bin number field is encoded using a unary code, and the offset is encoded using a binary code.

36 Claims, 7 Drawing Sheets

MEMORY EFFICIENT VARIABLE-LENGTH ENCODING/DECODING SYSTEM

BACKGROUND OF THE INVENTION

1. Field of the Invention

The present invention relates to data compression, and more specifically to lossless data compression using variable length coding.

2. Relevant Background

Data compression is playing an increasingly important role in technology as more and more data is collected, stored, and communicated in the modern information age. High definition televisions, cellular phones, and compact disk players are just a few examples of everyday products which use data compression to represent data.

Data compression is the process of reducing a large amount of information into a smaller-sized representation of the information. The process of compressing the information can be either lossy or lossless. Lossy compression, sometimes called irreversible compression, means that some of the original information is lost during the compression process and thus the original data cannot be perfectly restored from the compressed data representation. Lossy compression is typically used to compress images and sounds where a small amount of data loss is generally acceptable to people viewing or listening to the restored information. In a lossless compression mechanism no data is lost during compression. Lossless compression is reversible since the original information can be perfectly reconstructed from the compressed data representation. Lossless compression is mandatory for many types of data and program code information, and is well suited for text and text formatting compression, as well as images and sounds.

Typically, digital data is stored in fixed length units of bits such as 8 bits (byte). One common method of lossless compression called variable length coding involves representing fixed length data with variable length codewords. If shorter length codewords are selected for the most frequently occurring data and longer length codewords are used to represent infrequent data, the average number of bits used is typically reduced. This technique, for example, is similar to Morse code where frequently occurring letters of the alphabet are represented by short codewords (an "E" is ".") and lesser used letters are assigned longer codewords (an "X" is "-··-"). To restore the original message from the compressed message, the codewords are simply matched to the original letters using a lookup table. In a similar fashion, fixed length binary data can be compressed using variable length binary codewords to represent data. To restore the original binary message, the binary codewords are matched to the original binary data using a lookup table.

In order for variable length coding compression to work, the code must be uniquely decodable such that the original message can be decoded in one and only one way. Consider, for example, a code mapping of {x,y,z}={1,11,0}. This code is not uniquely decodable because it is impossible to determine from a compressed message containing two sequential one's whether the original message has two x's or a y. A uniquely decodable code is said to be a prefix-free code if every codeword can be decoded without having to read beyond the immediate codeword being examined. Thus, the binary code {x,y,z}={0,10,110} is a prefix-free code since reading a "0" in the present codeword indicates a codeword ending. On the other hand, the binary code {x,y,z}={0,01, 011} is not a prefix-free code since a "0" could mean the message contains x, y, or z, and reading the next codeword is necessary to decode the present codeword.

A well known procedure for generating prefix-free codes is called the Huffman coding procedure. Huffman codes are typically generated using a message tree structure dependent on the probability distribution of each letter in the message (frequency of occurrence of the letter divided by the message length). By way of the message tree structure, letters having the highest probability distribution are assigned the shortest codes. Table 1 shows a sample Huffman code mechanism for a set of letters with a hypothetical probability distribution in a message.

TABLE 1

Sample Huffman codewords

| Letter | Probability Distribution | Codeword |
|---|---|---|
| A | 0.2 | 0010 |
| B | 0.4 | 01 |
| C | 0.4 | 000 |
| D | 0.8 | 1 |
| E | 0.2 | 0011 |

Although Huffman coding is an effective technique for achieving high levels of data compression, it has the disadvantage of generally requiring a large lookup table to encode and decode data. A lookup table is needed to reverse the compression process and restore the original data from the coded data. Thus, the lookup table must typically be stored alongside the compressed data, decreasing the effective compression factor. For example, to represent about 128 codewords, one may need codes that are as much as 16 bits in length. This will require a table of size 64K entries. The table size may be reduced by hashing or exploiting the properties of the particular Huffman code used, but such a reduction increases compute time and severely limits the code's adaptability. A large lookup table can also make Huffman coding prohibitive in many embedded systems applications, where the memory available is relatively small. Furthermore, when the characteristics of the data change, the code's optimality is lost and hence a new table may be needed, decreasing the compression efficiency and possibly compute performance.

To avoid storing large lookup tables, Golomb coding techniques have been developed. Golomb codes can be thought of as a special set of variable length prefix-free codewords optimized for non-negative numbers having an exponentially decaying geometric probability distribution. The codewords are constructed such that they can be directly decodable without the need of a lookup table.

Golomb codes are composed of two parts: an integer portion of n/m represented using a unary code, and a n modulo m portion represented using a binary code, where n is a non-negative integer within the original source data and m is a coding factor based on the probability distribution of the data. The bit length of the binary code (n mod m) can be either $\lfloor \log_2 m \rfloor$ or $\lceil \log_2 m \rceil$, where $\lfloor x \rfloor$ denotes a floor function returning the greatest integer less than or equal to x, and $\lceil x \rceil$ denotes a ceiling function returning the least integer greater than or equal to x. The following conditions determine the bit length for the binary code:

$\lfloor \log_2 m \rfloor$ bits if $n < 2^{\lceil \log_2 m \rceil} - m$, and $\lfloor \log_2 m \rfloor$ bits otherwise.

Table 2 shows Golomb codewords for several values of parameter m where the unary code (integer(n/m)) is represented using zero runs followed by a one, and an inverse binary code is used to represent n mod m.

TABLE 2

Golomb codewords for various m in values

Golomb-Rice codes

| n= | m=1<br>k=0 | m=2<br>k=1 | m=3 | m=4<br>k=2 | m=5 | m=6 |
|---|---|---|---|---|---|---|
| 0 | 1 | 11 | 11 | 111 | 111 | 111 |
| 1 | 01 | 10 | 101 | 110 | 110 | 110 |
| 2 | 001 | 011 | 100 | 101 | 101 | 1011 |
| 3 | 0001 | 010 | 011 | 100 | 1001 | 1010 |
| 4 | 00001 | 0011 | 0101 | 0111 | 1000 | 1001 |
| 5 | 000001 | 0010 | 0100 | 0110 | 0111 | 1000 |
| 6 | ... | 00011 | 0011 | 0101 | 0110 | 0111 |
| 7 | ... | 00010 | 00101 | 0100 | 0101 | 0110 |
| 8 | ... | 000011 | 00100 | 00111 | 01001 | 01011 |

To make the binary implementation simple, m is restricted to be a k-th power of 2 such that $m=2^k$. This subset of the Golomb codes, commonly referred to as Rice codes, leads to very simple encoding and decoding procedures. The code for n is constructed by appending the k-th least significant bits of n (i.e. n mod m) to the unary representation of the number formed by the remaining higher order bits of n (i.e. integer(n/m)). Thus the binary portion of the Rice code has a fixed bit-length of k bits, and the total bit-length of any Rice codeword n is given by, $$bitLength\ (n) = \left\lfloor \frac{n}{2^k} \right\rfloor + 1 + k.$$

Generally, the optimal average codeword length for an input message, known as the message entropy, is calculated as the sum of each letter's probability distribution multiplied by its self-information. That is, $$H = -\sum_{i=1}^{m} P(A_i) \times \log_2 P(A_i),$$

where $P(A_i)$ is the probability distribution for letter $A_i$. Entropy defines the smallest possible average codeword length achievable using variable length coding, and is generally expressed in units of bits per codeword or bits per sample.

The actual average codeword length, also measured in bits per codeword, can be found by, $$l = \sum_{i=1}^{m} P(A_i) \times n(A_i),$$

where $n(A_i)$ is the number of bits in the codeword for letter $A_i$. While Golomb-Rice coding mechanisms are simple to implement and do not require a table, often they do not generate optimal codeword lengths for most data distributions since they assume an exponentially decaying geometric probability distribution.

There is therefore a need for a compression coding and decoding mechanism where the compression performance comes closer to the entropy of the input data. There is also a need for a compression mechanism with a small lookup table, thereby allowing implementation in lower memory embedded systems and reducing the compression overhead of the mechanism. Such a compression mechanism should be easily adaptable to a change in data distribution and be implemented simply and quickly in either software or hardware.

SUMMARY OF THE INVENTION

Briefly stated, the present invention involves a method for encoding a data element in a data stream suitable for use in a data compression mechanism. The method includes the operations of determining a bin having a range of values which includes the data element value, wherein a bin number is associated to the bin, computing an offset of the data element from a minimum bin value, wherein the minimum bin value is associated to the bin, and encoding the bin number and the offset.

The encoding operation may further include representing the bin number in a uniquely decodable code, such as a prefix-free code or a suffix-free code. The bin number may also be encoded using a unary code or a context prediction mechanism. The encoding operation may further include representing the offset in a binary code or gray code. The calculating an offset operation further include computing the offset from an algebraic function which includes the minimum bin value, such as by subtracting the minimum bin value from the data element.

The method may further include storing a bin size in a bin lookup table, wherein the bin size is associated to the bin, and the bin size may be limited to a power of two. In addition, the method may include storing the minimum bin value and/or maximum bin value in a bin lookup table. The method may further include outputting the encoded bin number and offset.

Still another aspect of the invention is a method for decoding a coded element in a data stream suitable for restoring compressed data, wherein the coded element includes a bin number field and an offset field. The method includes the operations of determining a minimum bin value from the bin number field and calculating an original data value from the minimum bin value and the offset field.

The determining operation further include calculating the minimum bin value by recursively adding bin size values. The method may further include the operation of decoding the bin number field and offset field. The calculating operation can include computing the original data value from an algebraic function which includes the minimum bin value, such as by adding the minimum bin value to the offset field. The method may also include outputting the original data value.

In accordance with another aspect of the invention, the invention is a data structure for use in a data compression mechanism of a source data element. The data structure includes a bin number field associated to a bin, where the bin has a range of values which includes the value of the source data element, and an offset field computed using a minimum bin value associated to the bin. The bin number field can be represented by a uniquely decodable code, such as a prefix-free code or a suffix-free code. Additionally, the bin number field can be represented by a unary code or a context prediction mechanism. The offset field can be represented by a binary code or a gray code, and can be calculated from an algebraic function which includes the minimum bin value, such as by subtracting the minimum bin value from the data element.

The data structure may further include a bin lookup table, wherein the lookup table includes a bin size associated to the bin, and the bin size may be limited to a power of two. The bin lookup table may further include the bin minimum value, or a maximum bin value associated to the bin.

In accordance with yet another aspect of the invention, the invention is an apparatus for encoding a data element in a data stream suitable for use in a data compression mechanism. The apparatus includes a locating unit capable of locating a bin having a range of values which includes the data element value, wherein a bin number is associated to the bin; a computing unit capable of computing an offset of the data element from a minimum bin value, wherein the minimum bin value is associated to the bin; and an encoding unit capable of encoding the bin number and the offset. The apparatus may further include a memory unit capable of storing a representation of the minimum bin value.

Still another aspect of the invention is an apparatus for decoding a coded element in a data stream suitable for restoring compressed data, wherein the coded element includes a bin number field and an offset field. The apparatus includes a lookup unit capable of determining a minimum bin value from the bin number field and a calculating unit capable of calculating an original data value from the minimum bin value and the offset field. The apparatus may further include a memory unit capable of storing a representation of the minimum bin value.

Still another aspect of the invention is a computer program product embodied in a tangible media suitable for use in a data compression mechanism. The tangible media may include a magnetic disk, an optical disk, a propagating signal, or a random access memory device.

DETAILED DESCRIPTION OF THE INVENTION

Figure 1A:
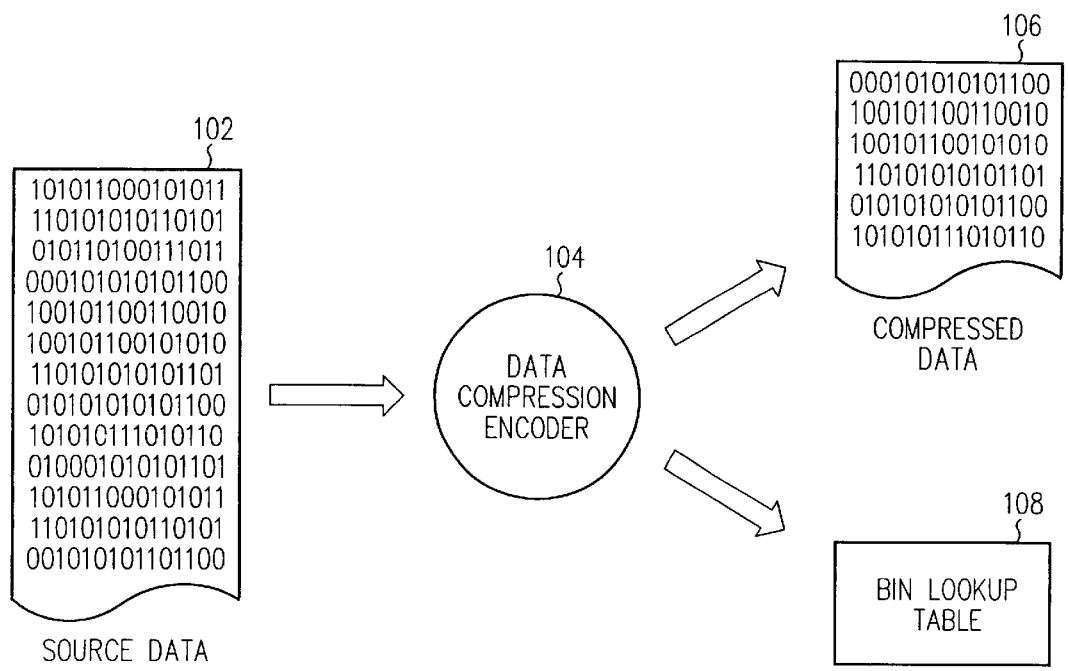
FIG. 1A is a schematic representation showing the lossless data compression system of the present invention.

FIG. 1A is a schematic representation showing the lossless data compression system of the present invention. As shown, digital source data 102 is passed to a data compression encoder 104 which produces compressed data 106 and a bin lookup table 108 (described further below). The source data 102 can contain any kind of information, including text, text formatting, video, program code, database entries, audio, speech, 2D and 3D graphical information, and may be in the form of a data file, a data packet, or other type of data stream. In the examples presented herein, the source data is treated as a set of unsigned integer values regardless of the actual meaning the data represents. This is valid as the compression method merely processes the data, and does not interpret the data. Treating the data as unsigned integer values simplifies the explanation and understanding of the present invention. It is contemplated that the data compression encoder 104 can be implemented in hardware, software, or a combination of the two to meet the needs of a particular application. Hardware implementations tend to operate faster while software implementations are often less expensive to produce. Although the compressed data 106 and the bin lookup table 108 are shown as separate data objects, this is done merely for explanatory purposes. It is contemplated that both the compressed data 106 and the bin lookup table 108 can be stored and/or transmitted as a single data object.

Figure 1B:
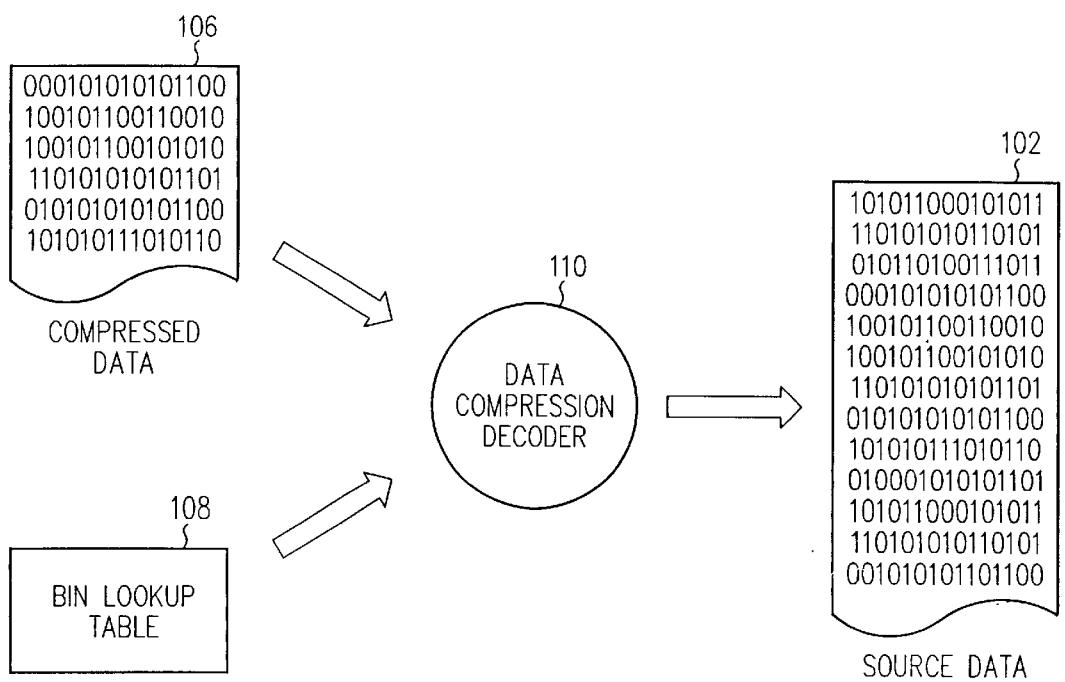
FIG. 1B shows a schematic representation of the data reconstruction system as contemplated by the present invention.

FIG. 1B shows a schematic representation of the data reconstruction system as contemplated by the present invention. The compressed data 106 and the bin lookup table 108 are passed to the data compression decoder 110, which produces the original source data 102. As mentioned earlier, the compression mechanism of the present invention is preferably implemented as a lossless compression mechanism, therefore the reconstructed source data is identical to the originally compressed source data. It is also contemplated that the data compression encoder 104 can be implemented in hardware, software, or a combination of the two.

The compressed data 106 of the present invention comprises codewords used to represent the source data 102. To understand the coding technique of the present invention, let D be the set of all possible non-negative numbers contained within the source data. Let D be divided in N+1 bins so that, $$D=\{Bin_0 \cup Bin_1 \cup \ldots \cup Bin_N\}.$$

Furthermore, let each bin $Bin_i$ contain size ($Bin_i$) consecutively numbered elements. Thus, each bin $Bin_i$ contains a range of numbers starting at the bin's minimum value (min_val($Bin_i$)) and ending at the bin's maximum value (max_val($Bin_i$)), where max_val($Bin_i$)=min_val($Bin_i$)+ (size($Bin_i$)−1) ).

With the above configuration, each source data value x within D can be represented by a codeword having a bin number field and an offset field. The bin number field is set equal to the bin number $Bin_i$ containing x within its range of values (min_val($Bin_i$) to max_val($Bin_i$)). The offset field is set equal to the difference between the source data value and the bin's minimum value (x−min_val($Bin_i$)). To restore the original source data value x from the codeword, the process is reversed. Thus, the source data x is equal to the offset field added to the minimum value min_val($Bin_i$) of the bin $Bin_i$ specified bin number field.

It should be noted that each bin's minimum value (min_val($Bin_i$)) must be known in order to encode and decode data. In one embodiment of the present invention, each bin's minimum value (min_val($Bin_i$)) is stored in a lookup table. In addition, it should be noted that the actual bin objects which carry the source data x are not stored anywhere in memory since each codeword contains both the bin number $Bin_i$ and the offset. The source data x can be found using only the codeword and the bin lookup table by the equation, x=min_val(Bin$_i$)+offset.

Figures 2A, 2B:
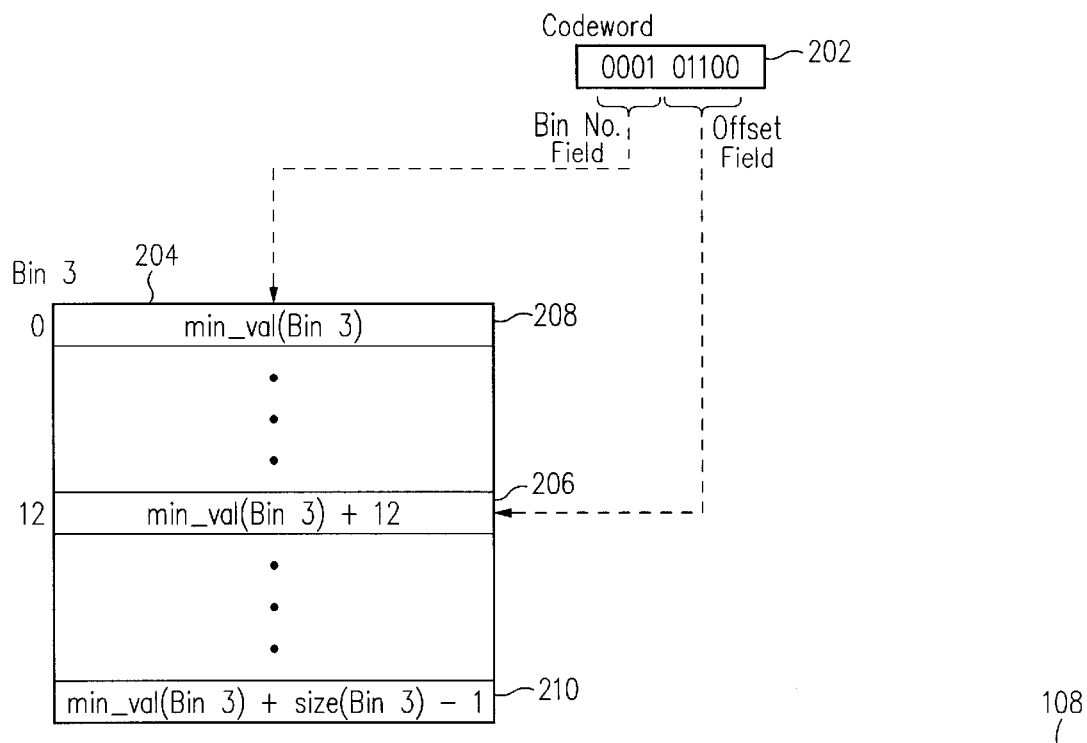
FIG. 2A and FIG. 2B show a representation of the codeword mechanism of the present invention.

FIG. 2A and FIG. 2B show a representation of the codeword mechanism of the present invention. A codeword 202 is divided into a bin number field and an offset field. The bin number field of FIG. 2 is represented using a unary code of consecutive zeros terminated by a one, where the number of zeros preceding the one identifies the bin. Table 3 lists more examples of the unary code used to indicate bin numbers. In another embodiment of the present invention, the unary code can be represented as a run of ones followed by a zero, where the number of ones preceding the zero identifies the bin.

TABLE 3

Examples of bin number unary codes

| Bin No. | Unary Code |
|---|---|
| 0 | 1 |
| 1 | 01 |
| 2 | 001 |
| 3 | 0001 |
| 4 | 00001 |

In FIG. 2A, the bin number field of codeword 202 indicates bin three, labeled 204 in FIG. 2A, is used. Therefore, the original source data value, labeled 206 in FIG. 2A, having the codeword 202 falls within the minimum value, labeled 208, and the maximum value, labeled 210, of bin three. In one embodiment of the present invention, a bin lookup table 212 is used to store each bin's minimum value 214 and size 216 (i.e. the number of elements in each bin).

To determine the exact value of the original source data 206 represented by the codeword 202, the offset field to the bin's minimum value. The offset field is represented using a binary code of known bit-length. The exact bit-length of the binary code is determined by the bin size entry 216 of the bin lookup table 212.

In a particular embodiment of the present invention, each bin size is constrained such that it is always a $K_i$-th power of 2, resulting in size $(Bin_i)=2^{k_i}$. Hence, given the bin $Bin_i$ in which a source data number belongs, the offset within the bin can be uniquely identified using $k_i$ fixed-length bits. Since the bin field is identified using a unary code (e.g. zero runs followed by 1), any bin can be represented using $Bin_i+1$ bits. As a result, the bit-length of any codeword in the bin $Bin_i$ is given by, bitLength($Bin_i$)=$Bin_i+1+k_i$.

Returning now to FIG. 2A and FIG. 2B, the bin number field of the codeword 202 is equal to 3, therefore i=3. In addition, since the offset field is five bits long, $k_3$=5 and size($Bin_3$)=$2^{k_3}$=32. The maximum value of bin three 210 is equal to min_val($Bin_3$)+31.

In another embodiment of the present invention, only the sizes of each bin are stored in the lookup table, thus eliminating the need to store each bin's minimum value. Using this embodiment, the lookup table can be defined by a vector K={$k_0, k_1, \ldots k_N$}, where K gives the bit-lengths of the offset field associated with every bin $Bin_i$. The minimum value (min_val($Bin_i$)) can be calculated dynamically during the encoding process from vector K by accumulating the bin size in each bin. As shown in Table 4, the minimum value for each bin is a function of the previous bit lengths, which can be recursively found.

TABLE 4

Bin minimum value calculations

| Bin No. | Bit Length | Bin Minimum Value |
|---|---|---|
| 0 | $k_0$ | 0 |
| 1 | $k_1$ | $2^{k0}$ |
| 2 | $k_2$ | $2^{k0} + 2^{k1}$ |
| 3 | $k_3$ | $2^{k0} + 2^{k1} + 2^{k2}$ |
| ... | ... | ... |

To further illustrate the coding mechanism of the above embodiment, consider the input source data defined by D={0,1,2,...,15} and a lookup table defined by K={2,3,2}, where N=2. The codewords for the elements of D are shown in Table 5.

TABLE 5

Example coding mechanism

| D | Bin | Offset | Codeword |
|---|---|---|---|
| 0 | 0 | 0 | 1 00 |
| 1 | 0 | 1 | 1 01 |
| 2 | 0 | 2 | 1 10 |
| 3 | 0 | 3 | 1 11 |
| 4 | 1 | 0 | 01 000 |
| 5 | 1 | 1 | 01 001 |
| 6 | 1 | 2 | 01 010 |
| 7 | 1 | 3 | 01 011 |
| 8 | 1 | 4 | 01 100 |
| 9 | 1 | 5 | 01 101 |
| 10 | 1 | 6 | 01 110 |
| 11 | 1 | 7 | 01 111 |
| 12 | 2 | 0 | 001 00 |
| 13 | 2 | 1 | 001 01 |
| 14 | 2 | 2 | 001 10 |
| 15 | 2 | 3 | 001 11 |

The described coding mechanisms are only a subset of the coding mechanisms of the present invention. It is contemplated that any uniquely decodable code (prefix-free or suffix-free) with a known structure can be used to identify the bin number. For example, a very small variable-length table may be used to identify the bins. In another variation of the invention, the initial bin number may be transformed to final bin number using an algebraic function and the final bin number is encoded. For example, let the set {0,1,2} contain the possible initial bin values and let the algebraic function be f(bin)=2−bin. Hence, the following initial/final bin number table is generated:

TABLE 6

Example of bin value transformation

| Initial Bin Number | Final Bin Number |
|---|---|
| 0 | 2 |
| 1 | 1 |
| 2 | 0 |

In a further variation, a context-based prediction mechanism can be used to identify bins, where the current code value is based on the previous code values and/or data values. For example, the offset field may store only the difference between the current offset value and the immediately preceding offset value. This technique is generally more useful in sound and image compression, where there are relatively small variations between adjacent data.

Likewise, the exact bit-pattern used to represent the offset value can be implemented in several different ways. For example, a bitwise inverse of the offset using $k_i$ bits can be used. In addition, the offset can be expressed using Gray code representation, where the consecutive offsets differ by no more than 1 bit. Gray code has some advantages with respect to error resilience, and a Gray code of length 3 bits is shown in Table 7. Furthermore, an algebraic function can be used to translate the offset field with $k_i$ bits to get the actual offset. This function could be a pre-defined function or an adaptive function.

TABLE 7

Example of gray coded offset

| Offset | Gray Code |
|---|---|
| 0 | 000 |
| 1 | 001 |
| 2 | 011 |
| 3 | 010 |
| 4 | 110 |
| 5 | 111 |
| 6 | 101 |
| 7 | 100 |

Figure 3:
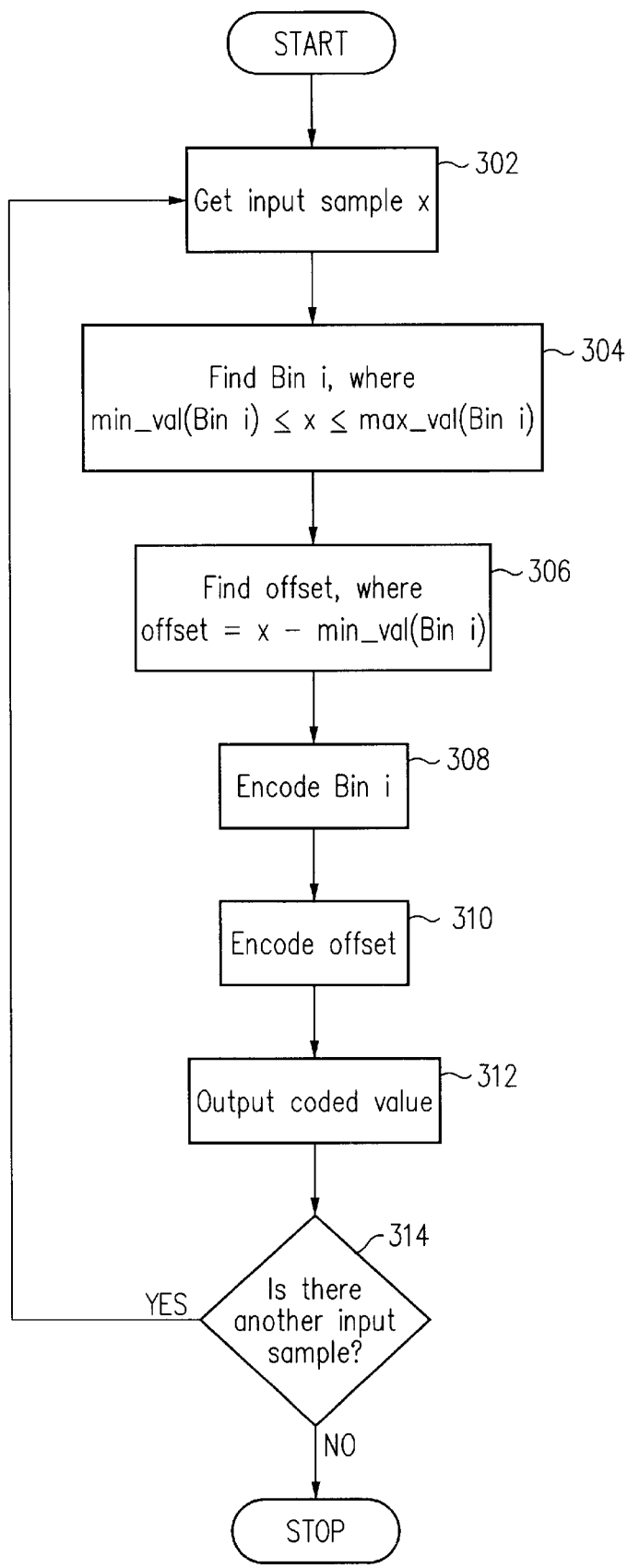
FIG. 3 shows a flow diagram illustrating a method of the present invention for compressing information composed of data units.

FIG. 3 shows a flow diagram illustrating a method of the present invention for compressing information composed of data units x. It is contemplated that this method may be executed in hardware, software, or a combination of both hardware and software. As mentioned earlier, the source data generally contains text, sound, image or perhaps mixed media information. In operation 302, a data unit x is input from the source data stream.

Next, in operation 304, the bin number containing a range of values encompassing the data unit x value is found. This operation involves comparing the minimum and maximum values of bins until the appropriate bin number is found satisfying the inequality, $min\_val(Bin_i) \leq x \leq max\_val(Bin_i)$. The values of $min\_val(Bin_i)$ and $max\_val(Bin_i)$ are either stored in or calculated from a bin lookup table. It is contemplated that the range of values for each bin may stay constant throughout the coding process, or may change according the data probability distribution.

In operation 306, an offset value is calculated after the bin number is found. The offset value is typically the difference between the data unit x and the bin's minimum value. It is contemplated that other algebraic functions may be used to calculate the offset. For example, the offset can be readily determined with reference to a maximum value or a mean value.

Next, in operations 308 and 310, the bin number and offset are encoded. Generally, the bin number is encoded using a variable-length unary code and the offset is encoded using a fixed-length binary code. It is contemplated, however, that other coding techniques may be used without departing from the spirit and scope of the invention. The coded value resulting from operations 308 and 310 is output in operation 312. The output value is the compressed representation of the original input sample x.

In operation 314, the source data is checked to see if more data samples exist. If there are more data samples to compress, the operation flow returns to operation 302 and another input sample is input and encoded. If no more data samples exist, the operation flow comes to an end.

Figure 4:
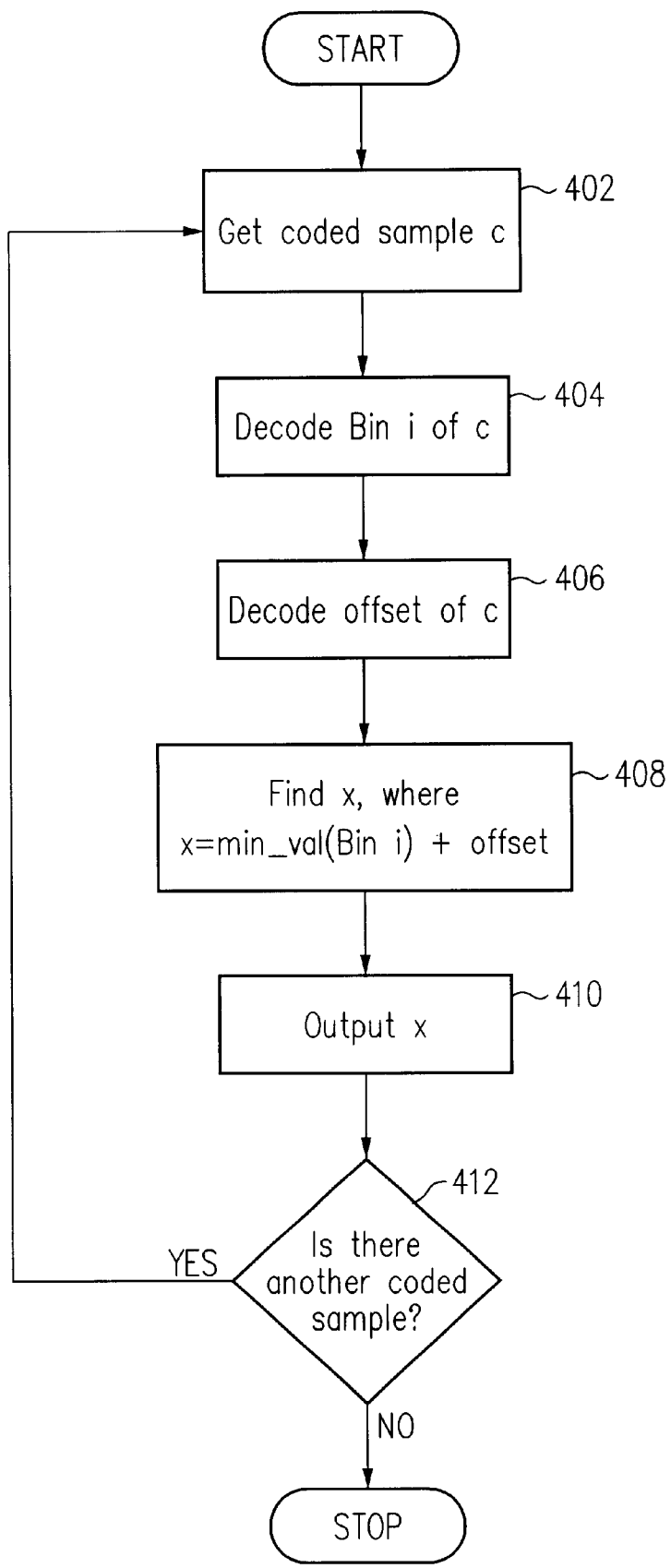
FIG. 4 shows a flow diagram illustrating a method of the present invention for restoring compressed data composed of coded data units.

FIG. 4 shows a flow diagram illustrating a method of the present invention for restoring compressed data composed of coded data units c. It is contemplated that this method may be executed in hardware, software, or a combination of both hardware and software.

In operation 402, a compressed data sample is input from a data stream. The compressed data is encoded using the coding technique of the present invention such that data sample includes a bin number field ($Bin_i$) and an offset field. Additionally, a bin lookup table is used to store or calculate each bin's minimum value $min\_val(Bin_i)$.

The bin number field and the offset field is decoded in operations 404 and 406 respectively. The actual decoding process of each field is dependent on how each field is coded. In general, the bin number is encoded using a variable-length unary code and the offset is encoded using a fixed-length binary code. It is contemplated, however, that other coding techniques may be used without departing from the spirit and scope of the invention.

Once the bin number is determined, the bin lookup table is accessed and the bin's minimum value $min\_val(Bin_i)$ is found. The minimum value is added to the offset (or otherwise combined according to the coding technique), yielding the original sample data value x in operation 408. The original sample data value x is output in operation in operation 410.

In operation 412, a check is made if more coded data samples exist. If there are more code data samples to decode, the operation flow returns to operation 302 and another sample is input and decoded.

If no more coded samples exist, the operation flow ends.

Figure 5:
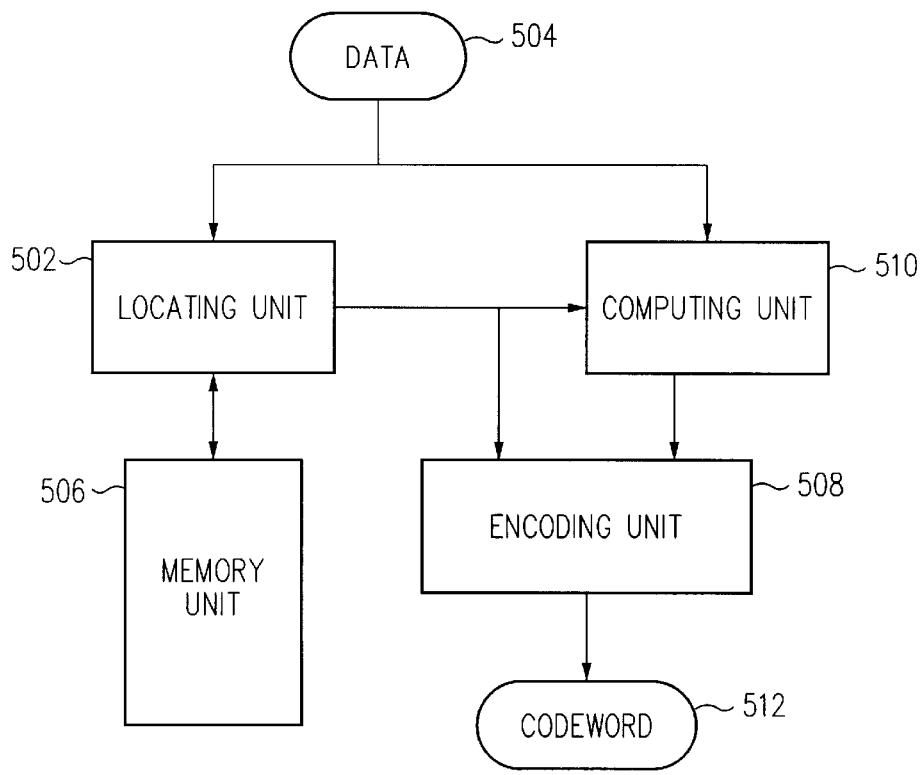
FIG. 5 is a block diagram illustrating an exemplary hardware embodiment of the data compression mechanism as contemplated by present invention.

FIG. 5 is a block diagram illustrating an exemplary hardware embodiment of the data compression mechanism as contemplated by present invention. A locating unit 502 receives a data sample 504 to be encoded and a memory unit 506 is used to store each bin's associated minimum value and size. The locating unit determines the bin with a value range encompassing the data sample 504. Once the appropriate bin is found, the locating unit 502 sends the bin number to an encoding unit 508 and the bin's minimum bin value to a computing unit 510. The computing unit 510 subtracts the minimum bin value from the source data 504 to arrive at an offset value. The offset value is then transferred from the computing unit 508 to the encoding unit 510. The encoding unit 508 generates a codeword 512 using the bin number and offset value received from the locating unit 502 and computing unit 510 respectively. The encoding unit 508 expresses the bin number in unary code and the offset value in binary code according the present invention, as previously detailed.

Figure 6:
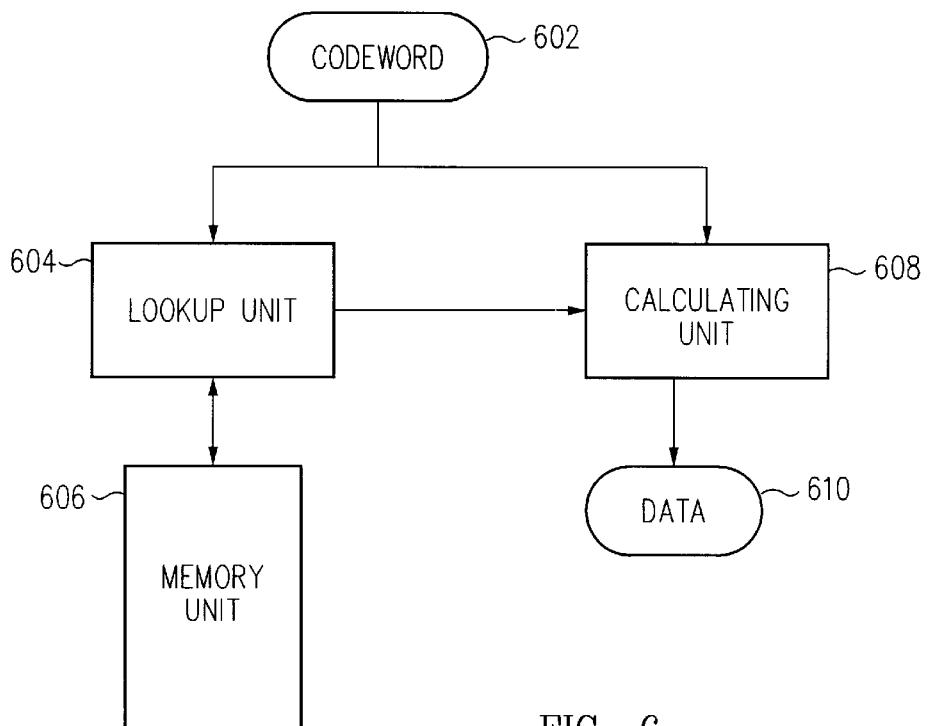
FIG. 6 is a block diagram illustrating an exemplary hardware embodiment of the data decompression mechanism as contemplated by present invention.

FIG. 6 is a block diagram illustrating an exemplary hardware embodiment of the data decompression mechanism as contemplated by present invention. A codeword 602 comprising a bin number and an offset value is input to a lookup unit 604. The lookup unit 604 searches a bin lookup table stored in a memory unit 606 and finds a bin minimum value of the bin specified by the bin number. The lookup unit 604 transfers the bin minimum value to a calculating unit 608 which adds the bin minimum value to the offset value portion of the codeword 602. The addition result is output from the calculating unit 608 as the original data sample value 610 of the codeword 602.

Figure 7:
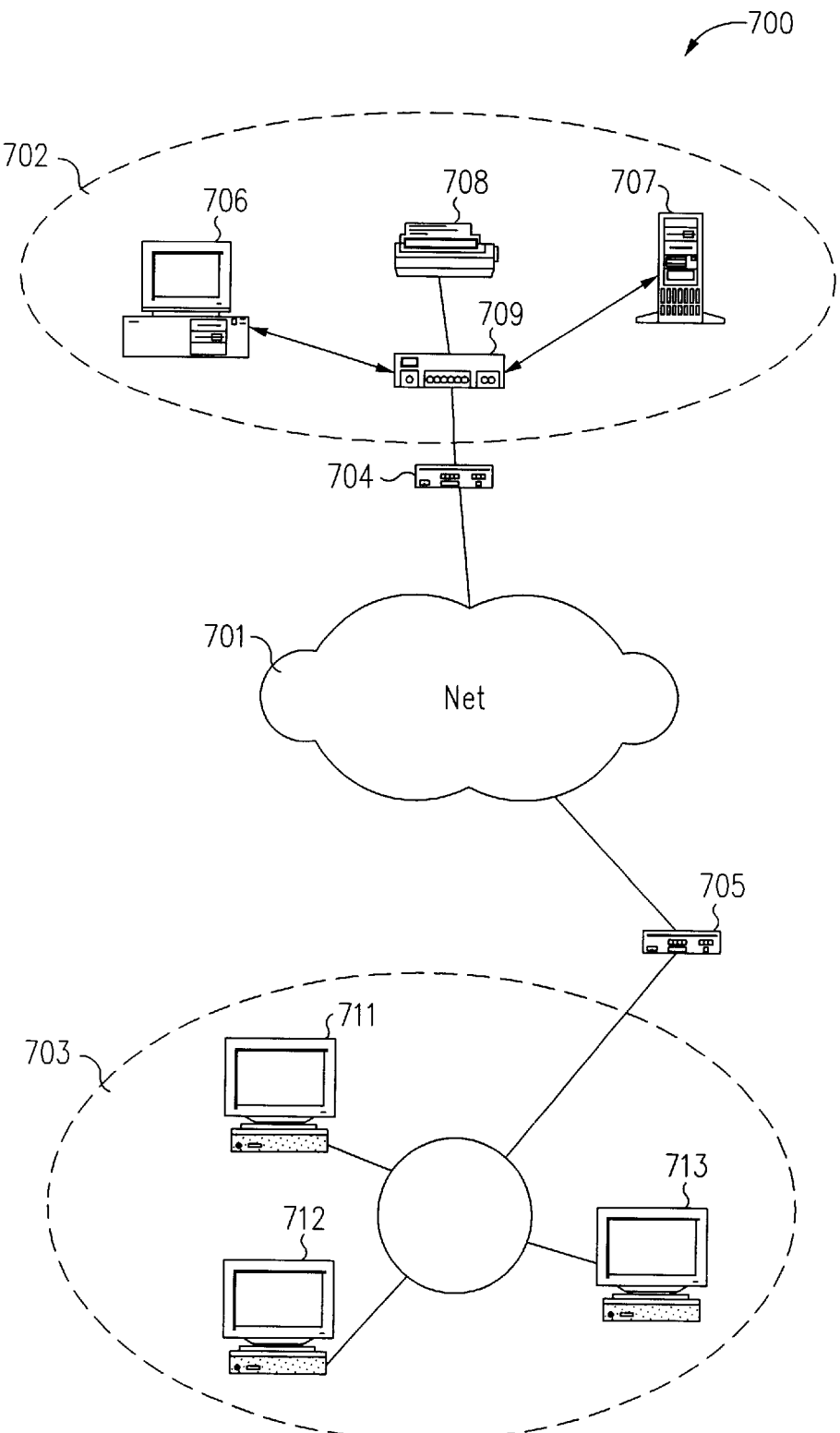
FIG. 7 shows an exemplary computing environment in which the present invention may be implemented.

FIG. 7 shows an exemplary computing environment 700 in which the present invention may be implemented. Essentially, a number of computing devices and groups of devices are interconnected through a network 701. For example, a LAN 702 and a LAN 703 are each coupled to network 701 through gateway machines 704 and 705 respectively. LANs 702 and 703 may be implemented using any available topology such as a hub and spoke topology of LAN 702 and a loop topology of LAN 703. LANs 702 and 703 may implement one or more server technologies including, for example a UNIX, Novell, or Windows NT, or peer-to-peer type network. Each network will include distributed storage implemented in each device and typically includes some mass storage device coupled to or managed by a server computer. Network 701 comprises, for example, a public network such as the Internet or another network mechanism such as a fibre channel fabric or conventional WAN technologies.

LAN 702 includes one or more workstations such as personal computer (PC) 706. LAN 702 also includes a server machine 707 and one or more shared devices such as printer 708. A hub or router 709 provides a physical connection between the various devices in LAN 702. Router 704 is coupled through gateway 709 to provide shared access to network 701. Gateway 709 may implement any desired access and security protocols to manage access between network 701 and devices coupled to network 702. Similarly, network 703 comprises a collection of workstations 711, 712 and 713 that share a common connection to network 701 through gateway 705.

Each of the devices shown in FIG. 7 may include memory, mass storage, and a degree of data processing capability sufficient to manage their connection to network 701. The computer program codes in accordance with the present invention are implemented in the memory of the various devices shown in FIG. 1 and enabled by the data processing capability of the devices shown in FIG. 7.

Figure 8A:
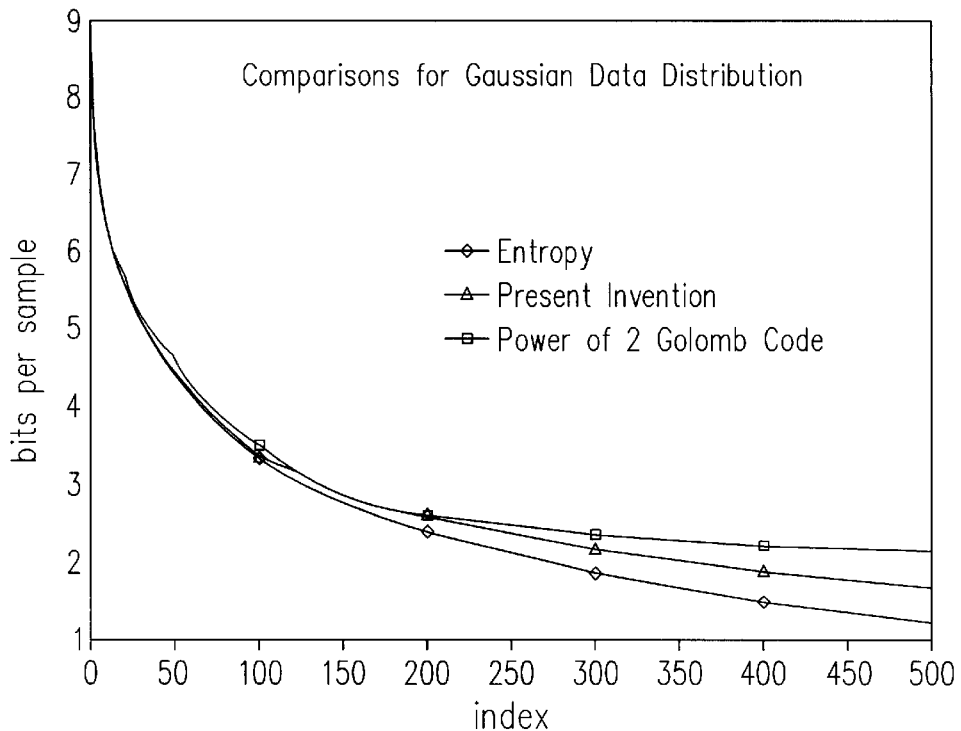
FIG. 8A shows a graphical comparison made with the power-of-two Golomb-Rice coding mechanism and the coding mechanism of the present invention for encoding random data with a Gaussian distribution.
Figure 8B:
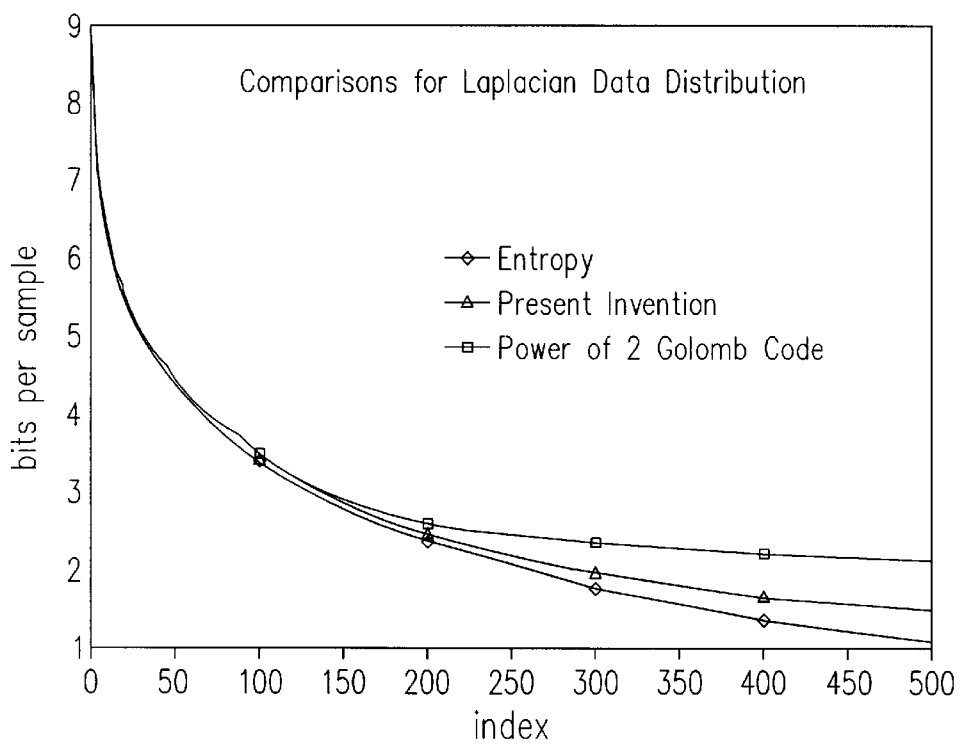
FIG. 8B shows a graphical comparison made with the power-of-two Golomb-Rice coding mechanism and the coding mechanism of the present invention for encoding random data with a Laplacian distribution.

FIG. 8A shows a graphical comparison made with the power-of-two Golomb-Rice coding mechanism and the coding mechanism of the present invention for encoding random data with a Gaussian distribution. FIG. 8B shows a graphical comparison made with the power-of-two Golomb-Rice coding mechanism and the coding mechanism of the present invention for encoding random data with a Laplacian distribution. In both graphs, the bins are encoded using zero runs and the number of elements in each bin is constrained to a power of two. In addition, the entropy of the random data is also plotted in each graph. The entropy gives the lower bound on the bits/sample that can be achieved for an input with the given distribution and the encoding bit-rate.

It is evident from the graphs of FIG. 8A and FIG. 8B that the coding mechanism of the present invention performs significantly better than the Golomb-Rice coding mechanism at bit-rates less than or equal to 3 bits/sample for both the distributions. At very low bit-rates (around 1 bit/sample), the present invention is approximately 33% better (more compression) for Gaussian data and approximately 43% better for Laplacian data. This difference continues to increase as the distribution of the input data gets more and more skewed around zero.

Although the invention has been described and illustrated with a certain degree of particularity, it is understood that the present disclosure has been made only by way of example, and that numerous changes, combinations and arrangements of techniques can be resorted to by those skilled in the art without departing from the spirit and scope of the invention, as hereinafter claimed.

The invention claimed is:

1. A method for encoding a data element in a data stream suitable for use in a data compression mechanism, the method comprising:

determining a bin having a range of values which includes the data element value, wherein a bin number is associated to the bin;

computing an offset of the data element from a minimum bin value, wherein the minimum bin value is associated to the bin; and encoding the bin number and the offset.

2. The method of claim 1, wherein the encoding operation further comprises representing the bin number in a uniquely decodable code.

3. The method of claim 1, wherein the encoding operation further comprises representing the bin number in a prefix-free code.

4. The method of claim 1, wherein the encoding operation further comprises representing the bin number in a suffix-free code.

5. The method of claim 1, wherein the encoding operation further comprises representing the bin number in a unary code.

6. The method of claim 1, wherein the encoding operation further comprises transforming the bin number to a final bin number using an algebraic function.

7. The method of claim 1, wherein the encoding operation further comprises representing the bin number in a context prediction mechanism.

8. The method of claim 1, wherein the encoding operation further comprises representing the offset in a binary code.

9. The method of claim 1, wherein the encoding operation further comprises representing the offset in a gray code.

10. The method of claim 1, wherein the calculating an offset operation further comprises computing the offset from an algebraic function which includes the minimum bin value.

11. The method of claim 1, wherein the calculating operation further comprises subtracting the minimum bin value from the data element.

12. The method of claim 1, further comprising storing a bin size in a bin lookup table, wherein the bin size is associated to the bin.

13. The method of claim 12, wherein the storing operation further comprises limiting the bin size to a power of two.

14. The method of claim 1, further comprising storing the minimum bin value in a bin lookup table.

15. The method of claim 1, further comprising storing a maximum bin value in a bin lookup table, wherein the maximum bin value is associated to the bin.

16. The method of claim 1, further comprising outputting the encoded bin number and offset.

17. A method for decoding a coded element in a data stream suitable for restoring compressed data, wherein the coded element includes a bin number field and an offset field, the method comprising:

determining a minimum bin value from the bin number field; and calculating an original data value from the minimum bin value and the offset field.

18. The method of claim 17, wherein the determining operation further comprises calculating the minimum bin value by recursively adding bin size values.

19. The method of claim 17, further comprising decoding the bin number field and offset field.

20. The method of claim 17, wherein the calculating operation further comprises computing the original data value from an algebraic function which includes the minimum bin value.

21. The method of claim 17, wherein the computing operation further comprises adding the minimum bin value to the offset field.

22. The method of claim 17, further comprising outputting the original data value.

23. An apparatus for encoding a data element in a data stream suitable for use in a data compression mechanism, the apparatus comprising:

a locating unit capable of determining a bin having a range of values which includes the data element value, wherein a bin number is associated to the bin;

a computing unit capable of computing an offset of the data element from a minimum bin value, wherein the minimum bin value is associated to the bin; and an encoding unit capable of encoding the bin number and the offset.

24. The apparatus of claim 23, further comprising a memory unit capable storing a representation of the minimum bin value.

25. An apparatus for decoding a coded element in a data stream suitable for restoring compressed data, wherein the coded element includes a bin number field and an offset field, the apparatus comprising:

a lookup unit capable of looking up a minimum bin value from the bin number field; and a calculating unit capable of calculating an original data value from the minimum bin value and the offset field.

26. The apparatus of claim 25, further comprising a memory unit capable of storing a representation of the minimum bin value.

27. A computer program product embodied in a tangible media comprising:

computer readable program codes coupled to the tangible media for encoding a data element in a data stream suitable for use in a data compression mechanism, the computer readable program codes comprising:

first computer readable program code configured to cause the data processor to determine a bin having a range of values which includes the data element value, wherein a bin number is associated to the bin;

second computer readable program code configured to cause the data processor to compute an offset of the data element from a minimum bin value, wherein the minimum bin value is associated to the bin; and third computer readable program code configured to cause the data processor to encode the bin number and the offset.

28. The computer program product of claim 27, wherein the tangible media comprises a magnetic disk.

29. The computer program product of claim 27, wherein the tangible media comprises an optical disk.

30. The computer program product of claim 27, wherein the tangible media comprises a propagating signal.

31. The computer program product of claim 27, wherein the tangible media comprises a random access memory device.

32. A computer program product embodied in a tangible media comprising:

computer readable program codes coupled to the tangible media for decoding a coded element in a data stream suitable for restoring compressed data, wherein the coded element includes a bin number field and an offset field, the computer readable program codes comprising:

first computer readable program code configured to cause the data processor to determine a minimum bin value from the bin number field; and second computer readable program code configured to cause the data processor to calculate an original data value from the minimum bin value and the offset field.

33. The computer program product of claim 32, wherein the tangible media comprises a magnetic disk.

34. The computer program product of claim 32, wherein the tangible media comprises an optical disk.

35. The computer program product of claim 32, wherein the tangible media comprises a propagating signal.

36. The computer program product of claim 32, wherein the tangible media comprises a random access memory device.

* * * * *